United States Patent
Schulze et al.

(10) Patent No.: US 8,528,401 B2
(45) Date of Patent: Sep. 10, 2013

(54) EXPLOSION-PROOF DEVICE

(75) Inventors: Sebastian Schulze, Quedlinburg (DE);
Uwe Wegemann, Sprockhoevel (DE);
Peter Angerstein, Oberhausen (DE);
Juergen Lehmkuhl, Dinslaken (DE)

(73) Assignee: KROHNE Messtechnik GmbH, Duisburg (DE)

( * ) Notice: Subject to any disclaimer, the term of this patent is extended or adjusted under 35 U.S.C. 154(b) by 0 days.

(21) Appl. No.: 13/211,640

(22) Filed: Aug. 17, 2011

(65) Prior Publication Data
US 2012/0198931 A1    Aug. 9, 2012

(30) Foreign Application Priority Data
Feb. 9, 2011 (DE) .......................... 10 2011 010 799

(51) Int. Cl.
*G01D 11/24* (2006.01)
*G01L 19/14* (2006.01)

(52) U.S. Cl.
USPC ......................................................... 73/431

(58) Field of Classification Search
USPC ......................................................... 73/431
See application file for complete search history.

(56) References Cited

U.S. PATENT DOCUMENTS

| | | | | |
|---|---|---|---|---|
| 4,885,943 A * | 12/1989 | Tootell et al. | ............... | 73/861.77 |
| 4,912,329 A * | 3/1990 | Weiner | ........................... | 250/343 |
| 4,938,928 A * | 7/1990 | Koda et al. | ....................... | 422/98 |
| 5,998,785 A | 12/1999 | Beck et al. | | |
| 6,898,980 B2 * | 5/2005 | Behm et al. | ..................... | 73/756 |
| 8,053,728 B2 * | 11/2011 | Chrzan et al. | ............... | 250/338.1 |
| 8,069,724 B2 | 12/2011 | Becherer et al. | | |
| 8,227,692 B2 * | 7/2012 | Dahlgren et al. | .......... | 174/50.54 |
| 2010/0283991 A1 * | 11/2010 | Chrzan et al. | ................... | 356/51 |
| 2011/0094880 A1 * | 4/2011 | Schlichte et al. | ............ | 204/400 |
| 2012/0088401 A1 * | 4/2012 | Mochizuki et al. | .......... | 439/559 |

FOREIGN PATENT DOCUMENTS

| | | |
|---|---|---|
| CA | 2 637 306 A1 | 2/1997 |
| DE | 37 11 754 A1 | 10/1988 |
| DE | 39 00 210 A1 | 7/1990 |
| DE | 195 32 646 A1 | 3/1997 |
| DE | 10 2007 028 909 A1 | 12/2008 |
| JP | 09182284 A * | 7/1997 |
| JP | 2005276045 A * | 10/2005 |
| JP | 2011041360 A * | 2/2011 |
| JP | 2012084317 A * | 4/2012 |
| WO | WO 2005093549 A1 * | 10/2005 |

OTHER PUBLICATIONS

DIN EN 60079-26:2007; Section 4.2.4, English Translation of 4.24.4. on p. 7.

* cited by examiner

*Primary Examiner* — Lisa Caputo
*Assistant Examiner* — Jamel Williams
(74) *Attorney, Agent, or Firm* — Roberts Mlotkowski Safran & Cole, P.C.; David S. Safran

(57) ABSTRACT

An explosion-proof device with a pressure-proof capsule (2), an electronic mechanism (3) and a signal receiver (4), wherein the electronic mechanism (3) is designed intrinsically safe, the pressure-proof capsule (2) has a radiolucent process window (5) and the signal receiver (4) is arranged inside of the pressure-proof capsule (2). An explosion-proof device that can be flexibly used and is economical is implemented in that the electronic device (3) is arranged within the pressure-proof capsule (2) and the signal receiver (4) is designed to be intrinsically safe.

9 Claims, 1 Drawing Sheet

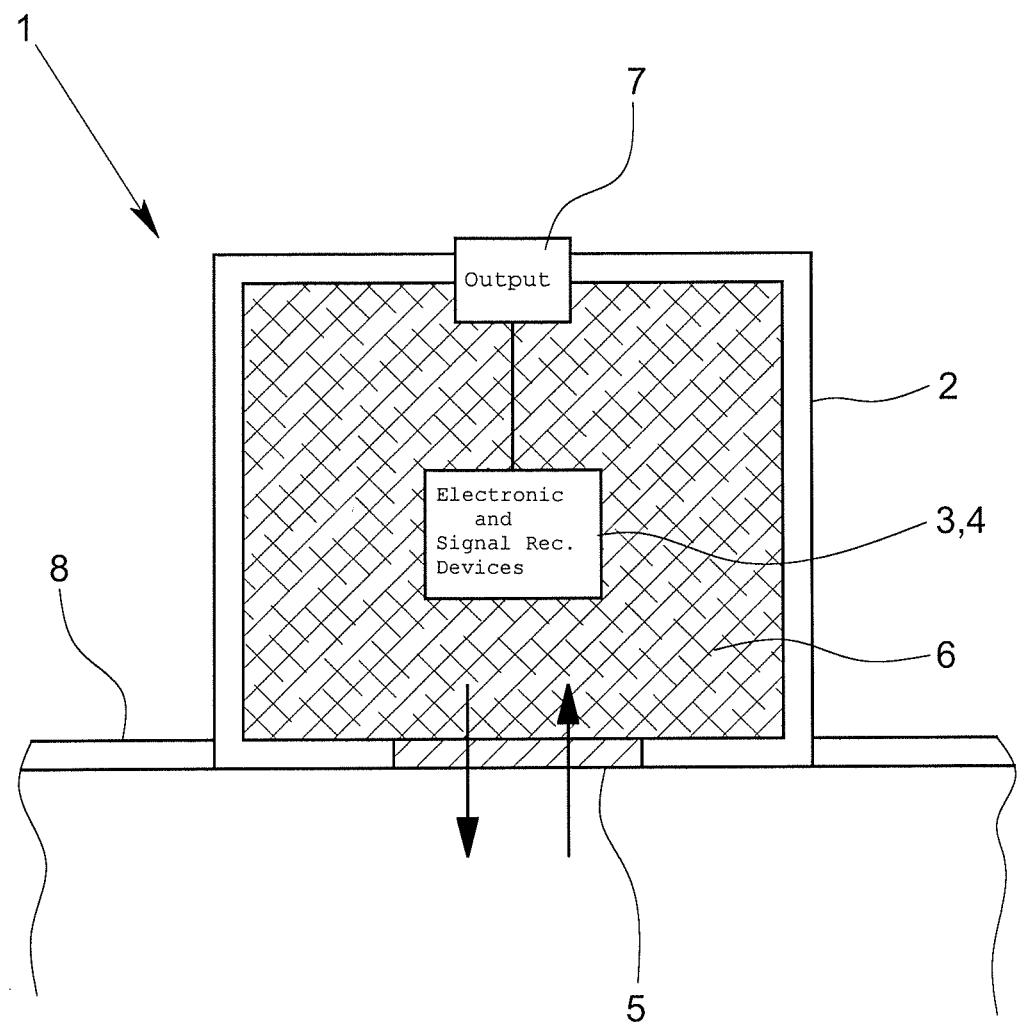

EXPLOSION-PROOF DEVICE

BACKGROUND OF THE INVENTION

1. Field of the Invention

The invention relates to an explosion-proof device with a pressure-proof capsule, an electronic means and a signal receiver, wherein the electronic means is designed to be intrinsically safe, the pressure-proof capsule has a radiolucent process window and the signal receiver is arranged inside of the pressure-proof capsule.

2. Description of Related Art

By an explosion-proof device, it is meant that a device is suitable for operation in areas with an explosive atmosphere. The radiolucent process window is permeable to at least a certain range of the electromagnetic spectrum, which the explosion-proof device can receive with the signal receiver. In particular, the radiolucent process window can be permeable to electromagnetic radiation, such as, e.g., visible light, infrared-, microwave-, radar-, X-ray, gamma- and ultraviolet radiation. It is also possible that the radiolucent process window is permeable to radiation that consists of particles, such as, e.g., alpha- and beta-radiation. This radiation can be then detected by the signal receiver. The explosion-proof device thus generally serves to detect radiation signals that are emitted by a process positioned on the side of the radiolucent process window not facing the electronic means. A radiation signal can merely consist of the radiation to be detected, being either present or not. A process can, for example, be a substance or mixture of substances in an aggregate state or multiple arbitrary aggregate states whose characteristics, presence or dynamics are to be monitored, determined or influenced.

Provisions for the construction and testing of intrinsically safe operating means that are determined for use in a field having gas explosion risks, as well as for corresponding operating means that are intended for connection to intrinsically safe electric circuits that are inserted into such areas are specified by the standard EN 60079-11 "explosive atmosphere—part 11: device protection by intrinsic safety 'I'." This standard also applies to electric operating means or parts of electric operating means that are located outside of the area at risk for gas explosion or are protected by another type of ignition protection in accordance with EN 60070-0, insofar as the intrinsic safety of the electric circuit in the area at risk for gas explosion is dependent on the design and construction of this electric operating means or of parts of this operating means.

The ignition protection intrinsic safety is based on the limitation of electric energy within operating means and connecting pipes that are subject to an explosive atmosphere at a level below that at which ignition can occur due either to spark formation or heating.

A further possible type of protection is the pressure-proof encapsulation. In this type of protection, also called "ex-d", the explosion protection is ensured by explosions possibly occurring within the capsule being shielded by the pressure-proof capsule in such a manner that a prevailing explosive atmosphere outside of the pressure-proof capsule is not ignited. Accesses in the wall of the capsule, thus, have to have an ignition spark resistant gap. The surface temperature of the capsule should not reach the ignition temperature of the surrounding explosive atmosphere in the case of an expected error. The standard EN 60079-1 "explosive atmospheres—part 1: device protection by pressure-proof encapsulation 'd'" specifies the requirements of operating means of this type of ignition protection.

A comparable principle of encapsulation similar to pressure-proof encapsulation ignition protection is molded encapsulation ignition protection, also called "ex-m." In molded encapsulation, components that could represent a potential source of ignition are coated with a casting compound suitable for this application. Using these measures, it is ensured that the surrounding explosive atmosphere does not come into contact with these components. In molded encapsulation ignition protection, the surface temperature should also not reach the ignition temperature of the surrounding explosive atmosphere in the case of an expected error. The standard EN 60079-18 "explosive atmosphere—part 18: device protection by molded encapsulation 'ex-m'" specifies the requirements for operating means of this type of ignition protection.

Devices known from the prior art are either designed in only one type of ignition protection, such as, e.g., pressure-proof encapsulation "ex-d" or intrinsically safe "ex-i" or are a mixture of forms in which the parts of the device are designed in a first type of ignition protection and other parts of the device are formed in another type of ignition protection.

An explosion-proof magnetic flowmeter is known from German Patent Application DE 37 11 754 A1 having a fittings pipe that can be installed in a pipeline with at least one measuring electrode on the inside of the pipe and at least one electromagnet assigned to the measuring electrode and constructed explosion-proof and joined to the fittings pipe, with an electric supply unit for supplying power to the magnetic coils and evaluation electronics, and a protective housing surrounding the supply unit. Here, the electric supply unit is separate from the intrinsically safe evaluation electronics within the protective housing in its own explosion-proof capsule, with cable entries for electric supply and cable exits for power supply to the magnetic coil and the evaluation electronics.

An essential disadvantage that results from the prior art is that connections from one part of a device, which is designed in a first type of ignition protection, to another part of a device, which is designed in another type of ignition protection, are often very complicated. For example, cable accesses through the wall of a pressure-proof capsule are particularly complicated, since the gaps occurring here have to be designed flashback resistant. Furthermore, safety barriers are required for connections between parts of a device designed with intrinsic safety and other parts of the device, which are designed in another type of ignition protection so that the intrinsic safety of the part of the device designed with intrinsic safety can be further guaranteed.

SUMMARY OF THE INVENTION

Thus, a primary object of the invention is to provide an explosion-proof device that can be applied flexibly and economically.

The above object is met based on the explosion-proof device described in the introduction that is improved by the electronic device being arranged within the pressure-proof capsule and the signal receiver being designed to be intrinsically safe.

In that the electronic device is arranged within the pressure-proof capsule and the signal receiver is designed intrinsically safe, it is possible that the device as a whole fulfills the requirements of two different types of ignition safety, namely, the requirements of the type of ignition safety "ex-d" and the requirements of the type of ignition safety "ex-i." Thus, the explosion-proof device according to the invention can be applied in areas that require explosion protection in accordance with the type of ignition safety "ex-d" as well as in areas that require explosion protection in accordance with the type of ignition protection "ex-i".

The type of ignition protection "ex-i" is mainly used in chemical industries as opposed to the type of ignition protection "ex-d" which is more likely to be found in oil and gas industries. The explosion-proof device according to the invention is thus suitable, without further modifications being required, for use in fields in which the type of ignition protection "ex-d" is required as well as in fields in which the type of ignition protection "ex-i" is required. This leads to considerable savings in production since only one version of the explosion-proof device has to be produced instead of two or more different versions, as was previously the case.

Furthermore, complicated cable accesses through the wall of the pressure-proof capsule are no longer necessary for connections between the electronic device and components located in the pressure-proof capsule, since the electronic device is arranged within the pressure-proof capsule.

According to an advantageous design of the invention, it is provided that the electronic device and/or the signal receiver have or has a casting compound.

Beyond a simple casting with a casting compound, it is also possible to provide all or a part of the components arranged within the pressure-proof capsule with a molded encapsulation, i.e., that they conform to the type of ignition protection "ex-m." By using molded encapsulation of all or a part of the components of the explosion-proof device arranged within the pressure-proof capsule, it is achieved that parts of the explosion-proof device or the whole explosion-proof device additionally conform or conforms to the requirements of the type of ignition protection "ex-m." This leads to comparable advantages for the use of the explosion-proof device according to the invention in areas with different requirements for explosion protection, as was described above in the example of the types of ignition protection "ex-d" and "ex-i."

Of course, the principle, that an explosion-proof device is designed according to the requirements of multiple types of ignition protection can be expanded to further types of ignition protection.

An advantageous design of the invention is wherein the casting compound at least partially fills up the inner space of the pressure-proof capsule. A partial or complete filling of the inner space of the pressure-proof capsule with casting compound increases the stability of the entire explosion-proof device. In particular, components of the explosion-proof device arranged inside of the pressure-proof capsule are protected against being shaken loose by mechanical vibrations or the like.

By filling the inner space of the pressure-proof capsule with casting compound, the remaining volume of the pressure-proof capsule without casting compound is reduced. This is of particular advantage, since this reduces the maximum-occurring explosion pressure.

An advantageous further development of the invention provides that the radiolucent process window is made of a material permeable to each radiation used, which fulfills, in particular, the requirements of EN 60079-1, for example, ceramics. An alternative design of the invention provides that the radiolucent process window is made of a carrier material and signal lines inserted therein, wherein the carrier material guarantees the structural integrity of the radiolucent process window and serves to seal the explosion-proof device and the signal lines arranged in the carrier material guide the radiation used. An example of such a radiolucent process window is a conductor of coaxial lines or other lines arranged in the ceramics.

According to a particularly advantageous further development of the invention, it is provided that the radiolucent process window is a glass window. The material glass is particularly suitable for the radiolucent process window of the explosion-proof device according to the invention. Glass is not only radiolucent in a wide range of the spectrum of electromagnetic radiation, but can also be dyed using appropriate additives, i.e., can be made impermeable for non-used regions of the spectrum of electromagnetic radiation, so that the characteristics of the radiolucent process window can be specifically adapted to the application. Furthermore, glass with the desired characteristics can be chosen from the variety of known types of glass. Additionally, manageable material costs are also a result of using glass for the radiolucent process window.

In a preferred design of the invention, it is provided that the glass window uses metal fused glass. Metal fused glass is thermally tempered special glass for process observation. During production, the glass pane is melted into a metal ring and is permanently joined to it. Different thermal expansion coefficients of glass and metal cause a homogenous state of compression stress in the entire glass body. An advantage that results from the use of metal fused glass for the radiolucent process window is that metal fused glass only shows surface cracks in the event of damage, but generally does not lead to a complete breakage.

According to a further preferred design of the invention, it is provided that the electronic means has a signal generator. The explosion-proof device according to the invention can be actively operated with a signal generator. This means that not only radiation originating from the observed process is received. The radiation signals that are generated by the signal generator and reach the process through the radiolucent process window interact with the process there, causing radiation coming from the process to be able to be received by the signal-receiving device after passing through the radiolucent process window. For example, luminescent processes fluorescence and phosphorescence are possible interactive processes, but dispersion, reflection and stimulated emission also come into consideration. It is essential that the radiation signals that are sent into the process, regardless of form, are the cause of the radiation detected by the signal-receiving device.

Furthermore, it is advantageous when the electronic device has a signal evaluating device. With the help of a signal evaluating device, the radiation coming from the process and detected by the signal-receiving device can be analyzed so that a partial or complete evaluation of the detected radiation already occurs in the explosion-proof device according to the invention. This has the advantage that a reduction of data achieved by the evaluation already occurs in the explosion-proof device according to the invention, which leads to the output of the information extracted from the detected radiation occurring possibly via, for example, a display directly located on the explosion-proof device according to the invention.

According to a further preferred improvement of the invention, it is provided that the explosion-proof device is a field device, in particular, a flowmeter, a fill level measuring device, a Geiger counter, a magnetic field sensor, a temperature measuring device or a photo detector.

The above-mentioned field devices represent a selection of the preferred possible fields of application of the explosion-proof device according to the invention. In particular, fill level measuring devices and flowmeters can profit from the teaching according to the invention, since these are often used in areas having atmospheres at risk of explosion.

In an advantageous design of the invention, it is provided that the explosion-proof device has an output device. According to a further advantageous design of the invention, it is provided that the output device is formed by a bus interface.

The data or—after evaluation has taken place or preliminary evaluation—information collected by the explosion-proof device according to the invention can be easily and reliably issued via an output device in the form of a bus interface, a display or a radio link.

In detail, there are various possibilities for designing and further developing the explosion-proof device according to the invention. Here, please refer to the patent claims subordinate to patent claim 1 as well as to the detailed description of preferred embodiments of the invention in conjunction with the drawing.

BRIEF DESCRIPTION OF THE DRAWING

The sole FIGURE shows an explosion-proof device according to the invention.

DETAILED DESCRIPTION OF THE INVENTION

The explosion-proof device 1 shown in the FIGURE has a pressure-proof capsule 2. An electronic device 3 and a signal-receiving device 4 are arranged within the pressure-proof capsule 2. The electronic device 3 and the signal-receiving device 4 are designed to be intrinsically safe.

A radiolucent process window 5 is provided in the wall of the pressure-proof capsule 2. The electronic device 3 and the signal-receiving device 4 have a casting compound 6. The casting compound 6 completely fills the inner space of the pressure-proof capsule 2.

The explosion-proof device 1 can issue data via an output device 7 that is joined to the electronic device 3 and the signal-receiving device 4. The explosion-proof device 1 is integrated in a process partition wall 8 found on the side of the process partition wall 8 facing away from the process. Similarly, the output device 7 is found on the side of the explosion-proof device 1 facing away from the process.

The radiolucent process window 5 is arranged on the side of the explosion-proof device 1 facing the process. A radiation exchange occurs via the radiolucent process window 5, shown here with arrows, between the signal-receiving device 4 and the process. In order to guarantee this radiation exchange, the radiolucent process window 5 and the casting compound of the casting 6, which is found between the radiolucent process window 5 and the signal-receiving device 4, are at least partially permeable to the radiation to be detected and also permeable to the signal radiation generated by the signal generator (not shown in detail here) of the electronic device 3.

What is claimed is:

1. Explosion-proof device, comprising:
    a pressure-proof capsule having a radiolucent process window,
    an intrinsically safe electronic device,
    an intrinsically safe signal receiver,
    wherein the intrinsically safe electronic means and the intrinsically safe signal receiver are located with the pressure-proof capsule, and
    wherein at least one of the electronic device and the signal receiver are enclosed in a molded encapsulation formed of a casting compound which at least partially fills up an inner space of the pressure-proof capsule.

2. Explosion-proof device according to claim 1, wherein the radiolucent process window is comprised of glass.

3. Explosion-proof device according to claim 2, wherein the glass window comprises metal fused glass.

4. Explosion-proof device according to claim 1, wherein the electronic device comprises a signal generator.

5. Explosion-proof device according to claim 1, wherein the electronic device comprises a signal evaluating unit.

6. Explosion-proof device according to claim 1, wherein the explosion-proof device is a field device.

7. Explosion-proof device according to claim 6, wherein said field device is one of a flowmeter, a fill level measuring device, a Geiger counter, a magnetic field sensor, a temperature measuring device and a photo detector.

8. Explosion-proof device according to claim 1, wherein the explosion-proof device has an output device.

9. Explosion-proof device according to claim 8, wherein the output device comprises a bus interface.

* * * * *